United States Patent
Ock

(10) Patent No.: US 12,182,404 B2
(45) Date of Patent: Dec. 31, 2024

(54) STORAGE DEVICE DETERMINING PRIORITIES ON THE BASIS OF TEMPERATURES OF MEMORY DIES AND TEMPERATURE VARIATIONS, AND METHOD THEREOF

(71) Applicant: SK hynix Inc., Icheon-si (KR)

(72) Inventor: Eun Jae Ock, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 16 days.

(21) Appl. No.: 18/166,425

(22) Filed: Feb. 8, 2023

(65) Prior Publication Data

US 2024/0152276 A1 May 9, 2024

(30) Foreign Application Priority Data

Nov. 7, 2022 (KR) .................. 10-2022-0146913

(51) Int. Cl.
*G06F 3/06* (2006.01)

(52) U.S. Cl.
CPC ............ *G06F 3/061* (2013.01); *G06F 3/0653* (2013.01); *G06F 3/0659* (2013.01); *G06F 3/0673* (2013.01)

(58) Field of Classification Search
CPC ...... G06F 3/061; G06F 3/0653; G06F 3/0659; G06F 3/0673
See application file for complete search history.

(56) References Cited

U.S. PATENT DOCUMENTS

| | | | |
|---|---|---|---|
| 10,803,921 B2 | 10/2020 | McVay | |
| 2014/0108841 A1* | 4/2014 | Tomi | G06F 1/3275 713/323 |
| 2014/0281311 A1* | 9/2014 | Walker | G06F 3/0631 711/170 |
| 2019/0043559 A1 | 2/2019 | McVay | |
| 2019/0339909 A1* | 11/2019 | Sethuraman | G06F 3/0659 |
| 2020/0105722 A1* | 4/2020 | Sethuraman | G11C 5/025 |
| 2023/0214149 A1* | 7/2023 | Vaghasiya | G06F 3/0679 711/154 |

FOREIGN PATENT DOCUMENTS

KR   10-2019-0008679 A   1/2019

* cited by examiner

*Primary Examiner* — Edward J Dudek, Jr.

(57) ABSTRACT

A storage device may determine first priority parameters and second priority parameters for a plurality of memory dies on the basis of temperatures of the plurality of memory dies measured at a first time point and a second time point. The storage device may determine priorities of the plurality of memory dies for a read operation or a write operation on the basis of the first priority parameters and the second priority parameters for the plurality of memory dies.

17 Claims, 10 Drawing Sheets

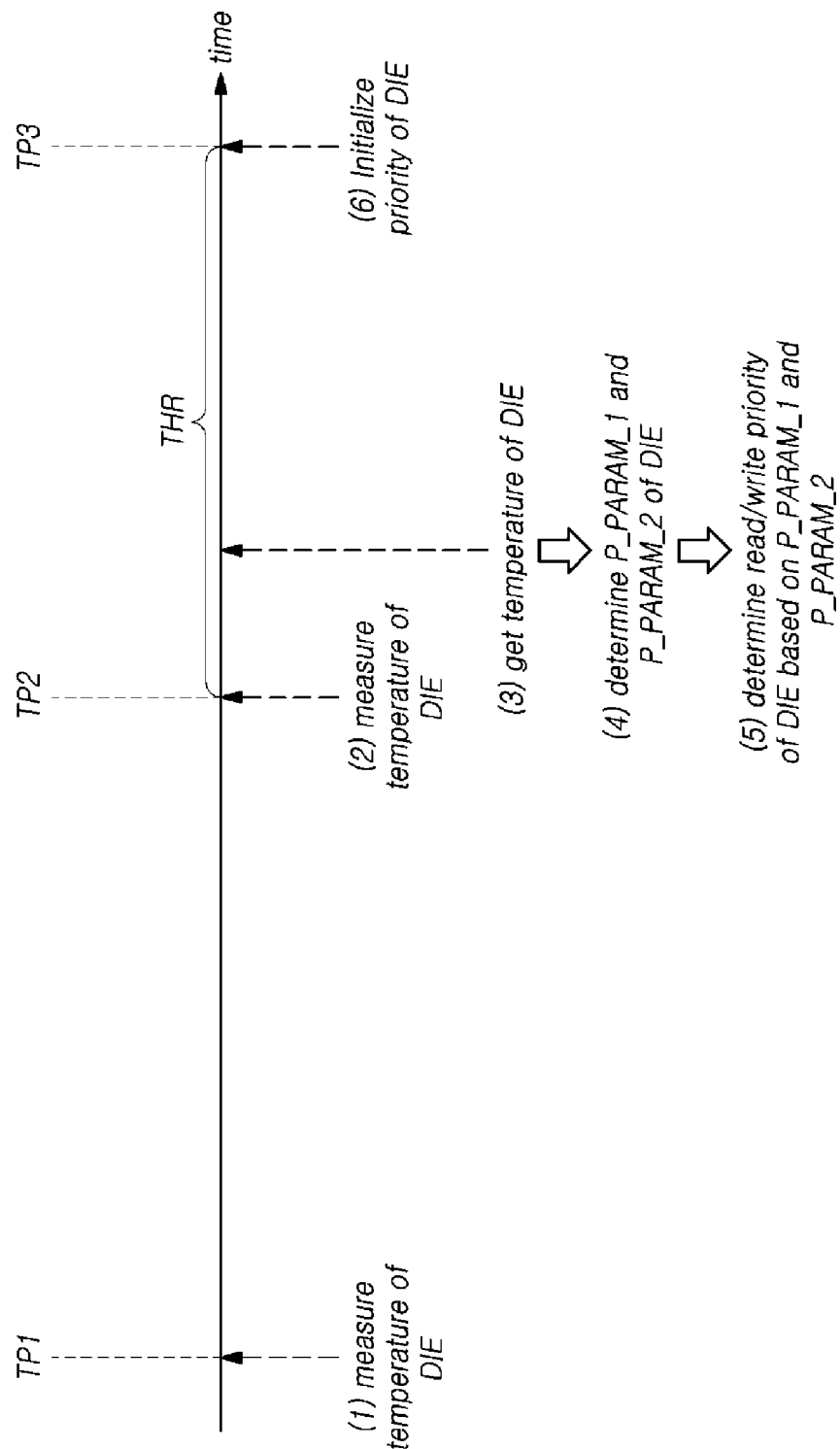

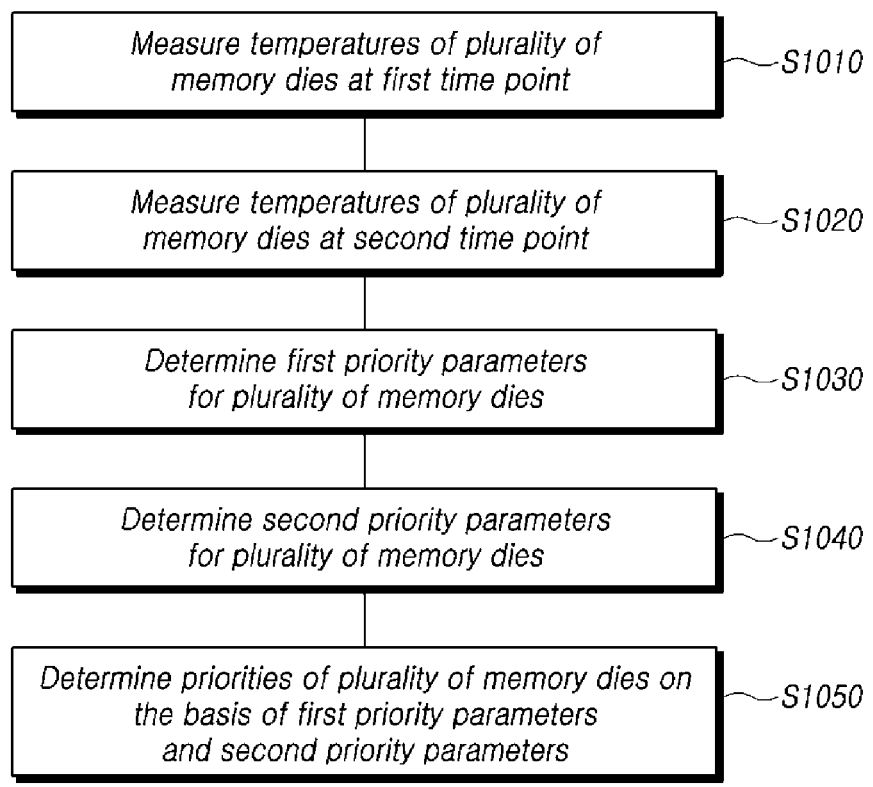

STORAGE DEVICE DETERMINING PRIORITIES ON THE BASIS OF TEMPERATURES OF MEMORY DIES AND TEMPERATURE VARIATIONS, AND METHOD THEREOF

CROSS-REFERENCE TO RELATED APPLICATION

The present application claims priority under 35 U.S.C. § 119(a) to Korean Patent Application No. 10-2022-0146913 filed in the Korean Intellectual Property Office on Nov. 7, 2022, which is incorporated herein by reference in its entirety.

BACKGROUND

1. Technical Field

Various embodiments generally relate to a storage device that determines priorities on the basis of temperatures of memory dies and temperature variations, and an operating method thereof.

2. Related Art

A storage device is a device that stores data on the basis of a request of an external device such as a computer, a mobile terminal such as a smartphone or a tablet, and various electronic devices.

The storage device may include a controller for controlling a memory (e.g., a volatile memory or a nonvolatile memory). The controller may receive a command from the external device, and may execute or control an operation for reading, writing or erasing data with respect to the memory included in the storage device, based on the received command.

When the storage device performs a read or write operation on the memory, the temperature of the memory may change. When the temperature of the memory increases, the storage device may perform a throttling operation of limiting the performance of a read operation or a write operation on the memory.

SUMMARY

Various embodiments are directed to a storage device and an operating method thereof, capable of minimizing performance degradation by maximally delaying a time point at which a throttling operation is executed due to an increase in the temperature of a memory.

In an embodiment, a storage device may include: i) a memory including a plurality of memory dies; and ii) a controller configured to obtain temperatures of the plurality of memory dies measured at a first time point and a second time point, to determine first priority parameters for the plurality of memory dies on the basis of the temperatures of the plurality of memory dies at the second time point, to determine second priority parameters for the plurality of memory dies on the basis of temperature variations of the plurality of memory dies during a time period between the first time point and the second time point, and to determine priorities of the plurality of memory dies for a read operation or a write operation on the basis of the first priority parameters and the second priority parameters for the plurality of memory dies.

In an embodiment, a method for operating a storage device may include: i) measuring temperatures of a plurality of memory dies at a first time point; ii) measuring temperatures of the plurality of memory dies at a second time point; iii) determining first priority parameters for the plurality of memory dies on the basis of the temperatures of the plurality of memory dies at the second time point; iv) determining second priority parameters for the plurality of memory dies on the basis of temperature variations of the plurality of memory dies during a time period between the first time point and the second time point; and v) determining priorities of the plurality of memory dies for a read operation or a write operation on the basis of the first priority parameters and the second priority parameters for the plurality of memory dies.

In an embodiment, a controller may include: i) a memory interface capable of communicating with a memory including a plurality of memory dies; and ii) a control circuit configured to determine first priority parameters and second priority parameters for the plurality of memory dies on the basis of temperatures of the plurality of memory dies measured at a first time point and a second time point, and to determine priorities of the plurality of memory dies according to which a read operation or a write operation is executed, on the basis of the first priority parameters and the second priority parameters for the plurality of memory dies.

According to embodiments of the disclosed technology, it is possible to minimize performance degradation by maximally delaying a time point at which a throttling operation is executed due to an increase in the temperature of a memory.

BRIEF DESCRIPTION OF THE DRAWINGS

FIG. 9 is a diagram illustrating another example of an operation according to a time related to a storage device according to an embodiment of the disclosure.

FIG. 10 is a diagram illustrating a method for operating a storage device according to an embodiment of the disclosure.

DETAILED DESCRIPTION

Figure 1:
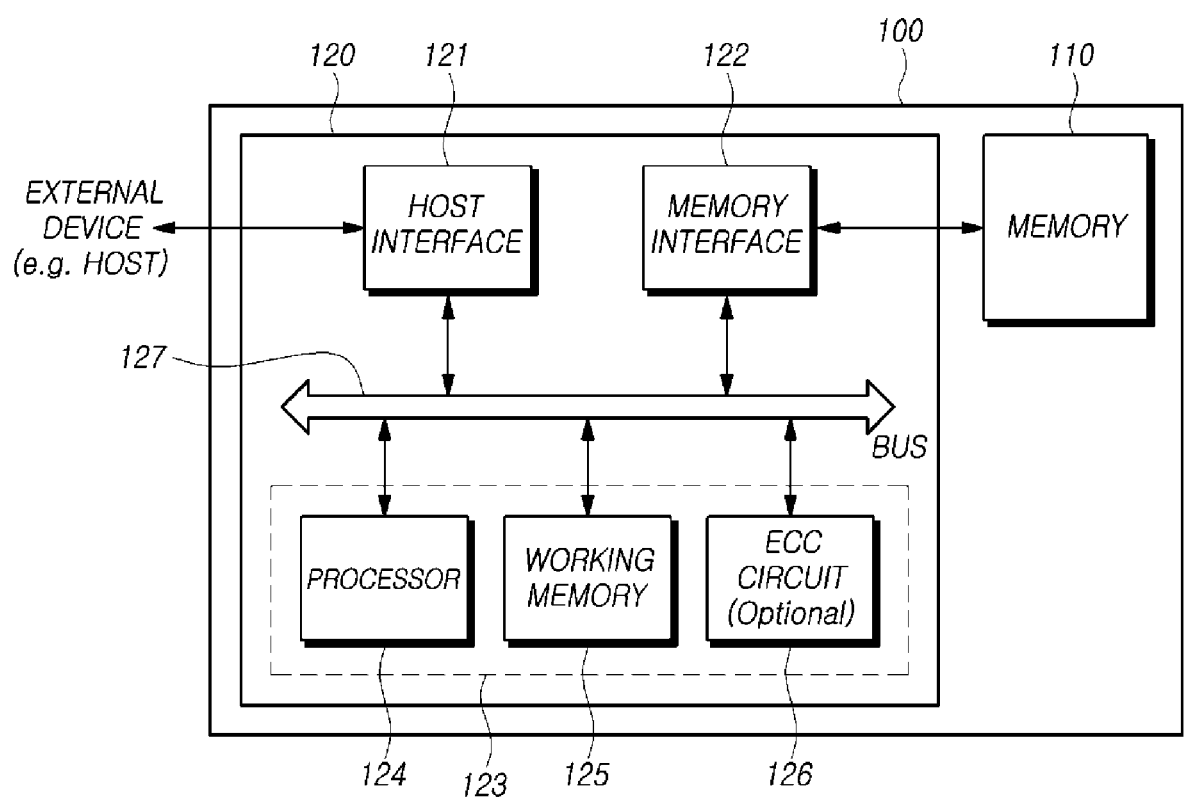
FIG. 1 is a schematic configuration diagram of a storage device according to an embodiment of the disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily limited to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a schematic configuration diagram of a storage device according to an embodiment of the disclosure.

Referring to FIG. 1, a storage device 100 may include a memory 110 that stores data, and a controller 120 that controls the memory 110.

The memory 110 includes a plurality of memory blocks, and operates in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells"), which store data. Such a memory cell array may exist in a memory block.

For example, the memory 110 may be implemented into various types such as a NAND flash memory, a 3D NAND flash memory, a NOR flash memory, a resistive random access memory (RRAM), a phase-change random access memory (PRAM), a magnetoresistive random access memory (MRAM), a ferroelectric random access memory (FRAM) and a spin transfer torque random access memory (STT-RAM).

The memory 110 may be implemented as a three-dimensional array structure. For example, embodiments of the disclosure may be applied to a charge trap flash (CTF) in which a charge storage layer is configured by a dielectric layer and a flash memory in which a charge storage layer is configured by a conductive floating gate.

The memory 110 may receive a command and an address from the controller 120 and may access an area that is selected by the address in the memory cell array. In other words, the memory 110 may perform an operation indicated by the command, on the area selected by the address.

The memory 110 may perform a program operation, a read operation or an erase operation. For example, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. For example, background operations may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. The controller 120, however, may control the operation of the memory 110 regardless or in the absence of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, a mobility device (e.g., a vehicle, a robot or a drone) capable of traveling under human control or autonomous driving, etc.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be devices that are separated from each other, or the controller 120 and the host may be implemented by being integrated into one device. Hereafter, for the sake of convenience in explanation, embodiments will be described with the controller 120 and the host separated from each other.

Referring to FIG. 1, the controller 120 may include a memory interface 122 and a control circuit 123, and may further include a host interface 121.

The host interface 121 provides an interface for communication with the host. For example, the host interface 121 provides an interface that uses at least one among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an SMBus (system management bus) protocol, an I2C (inter-integrated circuit) protocol, an I3C (improved inter-integrated circuit) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 in response to the control of the control circuit 123.

The control circuit 123 performs the general control operations of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110 by using a derandomizing seed. The derandomized data may be outputted to the host.

The processor 124 may execute firmware to control the operation of the controller 120. Namely, in order to control the general operation of the controller 120 and perform a logic calculation, the processor 124 may execute (drive) firmware loaded in the working memory 125 upon booting. Hereafter, embodiments of an operation of the storage device 100 will be described as implemented in such a way that the processor 124 executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one from among a flash translation layer (FTL), which performs a translating function between a logical address requested to the storage device 100 from the host and a physical address of the memory 110; a host interface layer (HIL) which serves to analyze a command requested to the storage device 100 as a storage device from the host and transfer the command to the flash translation layer (FTL); and a flash interface layer (FIL), which transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware, in which a logic calculation to be performed is defined, is stored in the memory 110 but is not loaded in the working memory 125, the processor 124 may generate an event (e.g., an interrupt) for loading the corresponding part of the firmware into the working memory 125 from the memory 110.

The processor 124 may load metadata necessary for driving firmware, from the memory 110. The metadata, as data for managing the memory 110, may include management information on user data stored in the memory 110.

Firmware may be updated while the storage device 100 is manufactured or while the storage device 100 is executed. The controller 120 may download new firmware from the outside of the storage device 100 and update existing firmware with the new firmware.

The working memory 125 may store firmware, a program code, a command and data that are necessary to drive the controller 120. A working memory 125 may be, for example, a volatile memory that includes at least one among an SRAM (static RAM), a DRAM (dynamic RAM) and an SDRAM (synchronous DRAM).

The error detection and correction circuit 126 may detect an error bit of target data and correct the detected error bit, by using an error correction code. The target data may be, for example, data stored in the working memory 125 or data read from the memory 110.

The error detection and correction circuit 126 may be implemented to decode data by using an error correction code. The error detection and correction circuit 126 may be implemented by various code decoders. For example, a decoder that performs unsystematic code decoding or a decoder that performs systematic code decoding may be used.

For example, the error detection and correction circuit 126 may detect an error bit by the unit of a set sector in each of read data. Each read data may be constituted by a plurality of sectors. A sector may mean a data unit that is smaller than a page, which is the read unit of a flash memory. Sectors constituting each read data may be matched with one another using an address.

The error detection and correction circuit 126 may calculate a bit error rate (BER), and may determine whether an error is correctable or not by units of sectors. For example, when a bit error rate (BER) is higher than a set reference value, the error detection and correction circuit 126 may determine that a corresponding sector is uncorrectable or a fall. On the other hand, when a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, then the error detection and correction circuit 126 may detect an uncorrectable sector. There may be one or more sectors that are determined to be uncorrectable. The error detection and correction circuit 126 may transfer information (for example, address information) regarding a sector which is determined to be uncorrectable, to the processor 124.

A bus 127 may be configured to provide channels among the components 121, 122, 124, 125 and 126 of the controller 120. The bus 127 may include, for example, a control bus for transferring various control signals, commands and the like, a data bus for transferring various data, and so forth.

Some of the components among the above-described components 121, 122, 124, 125 and 126 of the controller 120 may be omitted, or some of the components among the above-described components 121, 122, 124, 125 and 126 of the controller 120 may be integrated into one component. In other embodiments, one or more other components may be added in addition to the above-described components 121, 122, 124, 125 and 126 of the controller 120.

Hereinbelow, the memory 110 will be described in further detail with reference to FIG. 2.

Figure 2:
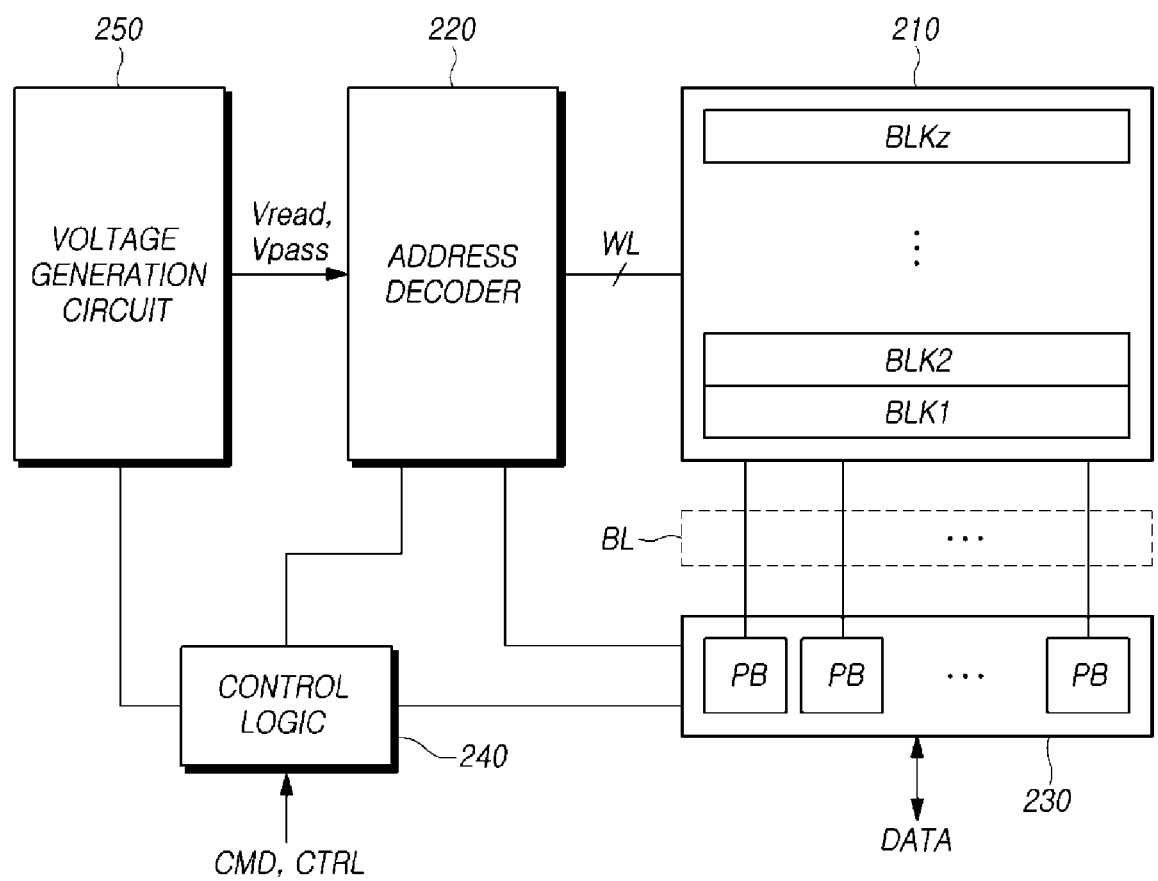
FIG. 2 is a diagram schematically illustrating a memory of FIG. 1.

FIG. 2 is a diagram schematically illustrating a memory of FIG. 1.

Referring to FIG. 2, a memory 110 may include a memory cell array 210, an address decoder 220, a read and write circuit 230, a control logic 240, and a voltage generation circuit 250.

The memory cell array 210 may include a plurality of memory blocks BLK1 to BLKz (where z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells that have vertical channel structures.

The memory cell array 210 may be configured by a memory cell array of a two-dimensional structure or may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) that stores 1-bit data. In another instance, each of the plurality of memory cells included in the memory cell array 210 may be a multi-level cell (MLC) that stores 2-bit data. In still another instance, each of the plurality of memory cells included in the memory cell array 210 may be a triple level cell (TLC) that stores 3-bit data. In yet another instance, each of the plurality of memory cells included in the memory cell array 210 may be a quad level cell (QLC) that stores 4-bit data. In a further instance, the memory cell array 210 may include a plurality of memory cells, each of which stores 5 or more-bit data.

The number of bits of data stored in each of the plurality of memory cells may be dynamically determined. For example, a single-level cell that stores 1-bit data may be changed to a triple-level cell that stores 3-bit data.

Referring to FIG. 2, the address decoder 220, the read and writhe circuit 230, the control logic 240 and the voltage generation circuit 250 may operate as a peripheral circuit that drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

During a read operation, the address decoder 220 may apply the read voltage Vread to a selected word line WL in a selected memory block in a read voltage applying operation. The address decoder 220 may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one from among a block address, a row address and a column address.

The address decoder 220 may select one memory block and one word line depending on a block address and a row address. A column address may be decoded by the address decoder 220 and be provided to the read and write circuit 230.

The address decoder 220 may include at least one from among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit that includes a plurality of page buffers PB. The read and write circuit 230 may include data buffers that take charge of a data processing function, and may further include cache buffers that take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, changes in the amounts of current flowing depending on the programmed states of the corresponding memory cells.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. As an exemplary embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A memory cell may be coupled to one of the plurality of word lines WL and one of the plurality of bit lines BL. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate, which is surrounded by a dielectric, and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

At least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
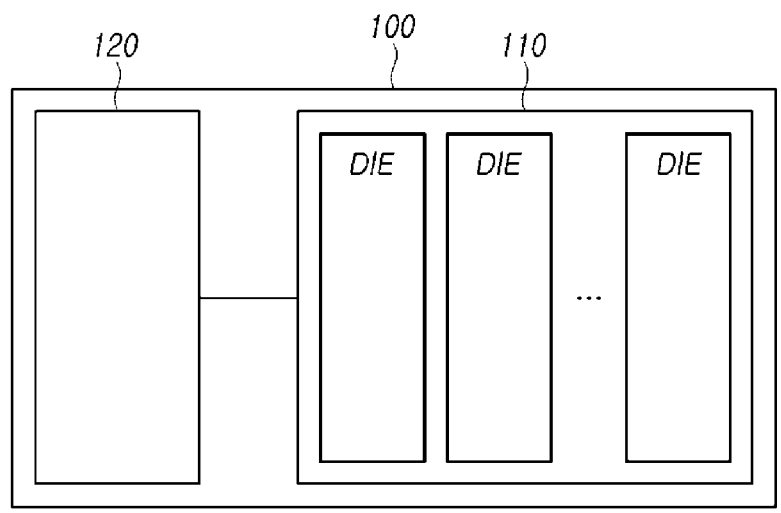
FIG. 3 is a diagram illustrating a schematic structure of a storage device according to an embodiment of the disclosure.

FIG. 3 is a diagram illustrating a schematic structure of a storage device according to an embodiment of the disclosure.

Referring to FIG. 3, a storage device 100 may include a memory 110 and a controller 120.

The memory 110 may include a plurality of memory dies DIE. Each of the plurality of memory dies DIE may include a plurality of memory blocks described above with reference to FIG. 1. Each of the plurality of memory blocks may include a plurality of pages. As described above, page may be a unit by which data is read or written.

The controller 120 may obtain temperatures of the plurality of memory dies DIE, which are measured at a first time point and a second time point. An example of an operation in which the storage device 100 measures temperatures of the plurality of memory dies DIE will be described with reference to FIG. 4.

The controller 120 may determine first priority parameters and second priority parameters for the plurality of memory dies DIE. This will be described with reference to FIGS. 5 to 7.

The controller 120 may determine priorities of the plurality of memory dies DIE for a read operation or a write operation on the basis of the first priority parameters and the second priority parameters for the plurality of memory dies DIE. Priorities described in the embodiment of the disclosed technology mean priorities of the plurality of memory dies DIE for a read operation or a write operation.

The priorities of the plurality of memory dies DIE for a read operation or a write operation may be used in determining an order in which data is read from the plurality of memory dies DIE or an order in which data is written to the plurality of memory dies DIE. According to the priorities of the plurality of memory dies DIE for a read operation or a write operation, the controller 120 may determine to which memory die data should be first written when processing a write command queued in a command queue, and may determine from which memory die data should be first read when processing a read command queued in the command queue.

For example, when executing a read operation on the plurality of memory dies DIE, the controller 120 may read data stored in a memory die with a high priority prior to reading data stored in a memory die with a low priority.

In another example, when executing a write operation on the plurality of memory dies DIE, the controller 120 may first write data to a memory die with a high priority and then write data to a memory die with a low priority.

Although a read or write operation on a memory die with a high priority is quickly performed, the die temperature quickly rises correspondingly. On the other hand, although a read or write operation on a memory die with a low priority is slower, die temperature rises slowly instead.

An operation in which the controller 120 determines priorities of the plurality of memory dies DIE for a read operation or a write operation will be described in detail with reference to FIG. 8.

Figure 4:
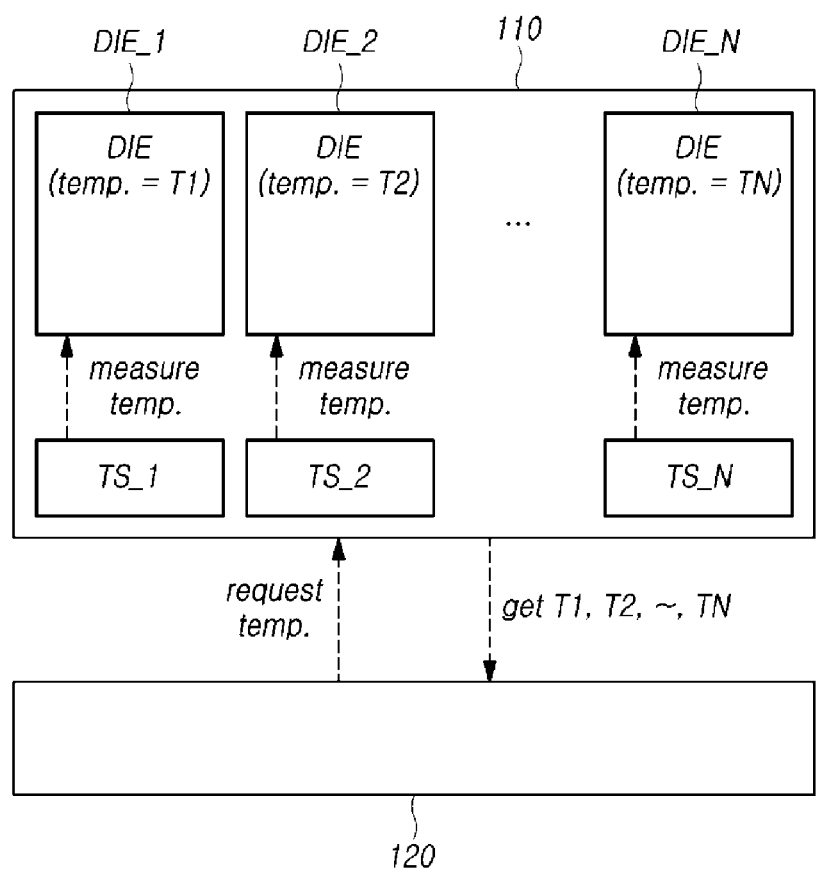
FIG. 4 is a diagram illustrating an example of an operation of measuring temperatures of a plurality of memory dies according to an embodiment of the disclosure.

FIG. 4 is a diagram illustrating an example of an operation of measuring temperatures of a plurality of memory dies DIE according to an embodiment of the disclosure.

Referring to FIG. 4, a memory 110 of a storage device 100 may include N (where N is a natural number of 2 or greater) number of memory dies DIE_1, DIE_2, . . . , and DIE_N.

The memory 110 may include N number of temperature sensors TS_1, TS_2, . . . , and TS_N for measuring temperatures of the N number of memory dies DIE_1, DIE_2, . . . , and DIE_N.

Each of the N number of temperature sensors TS_1, TS_2, . . . , and TS_N may measure the temperature of a corresponding memory die among the N number of memory dies DIE_1, DIE_2, . . . , and DIE_N. For example, the temperature sensor TS_1 may measure a temperature T1 of the memory die DIE_1, the temperature sensor TS_2 may measure a temperature T2 of the memory die DIE_2, and the temperature sensor TS_N may measure a temperature TN of the memory die DIE_N.

A controller 120 of the storage device 100 may obtain temperatures of the N number of memory dies DIE_1, DIE_2, . . . , and DIE_N measured by the N number of temperature sensors TS_1, TS_2, . . . , and TS_N.

For example, the controller 120 may obtain the temperature T1 of the memory die DIE_1 by accessing the temperature sensor TS_1, may obtain the temperature T2 of the memory die DIE_2 by accessing the temperature sensor TS_2, and may obtain the temperature TN of the memory die DIE_N by accessing the temperature sensor TS_N.

In another example, temperatures measured by the N number of temperature sensors TS_1, TS_2, . . . , and TS_N may be stored in a separate storage area (e.g., a register), and the controller 120 may obtain the temperatures of the number of memory dies DIE_1, DIE_2, . . . , and DIE_N by accessing the corresponding storage area.

In still another example, the controller 120 may transmit, to the memory 110, a command requesting temperatures measured by the N number of temperature sensors TS_1, TS_2, . . . , and TS_N, and as a response to the corresponding command, the memory 110 may transmit, to the controller 120, a command indicating the temperatures of the N number of memory dies DIE_1, DIE_2, . . . , and DIE_N.

Figure 5:
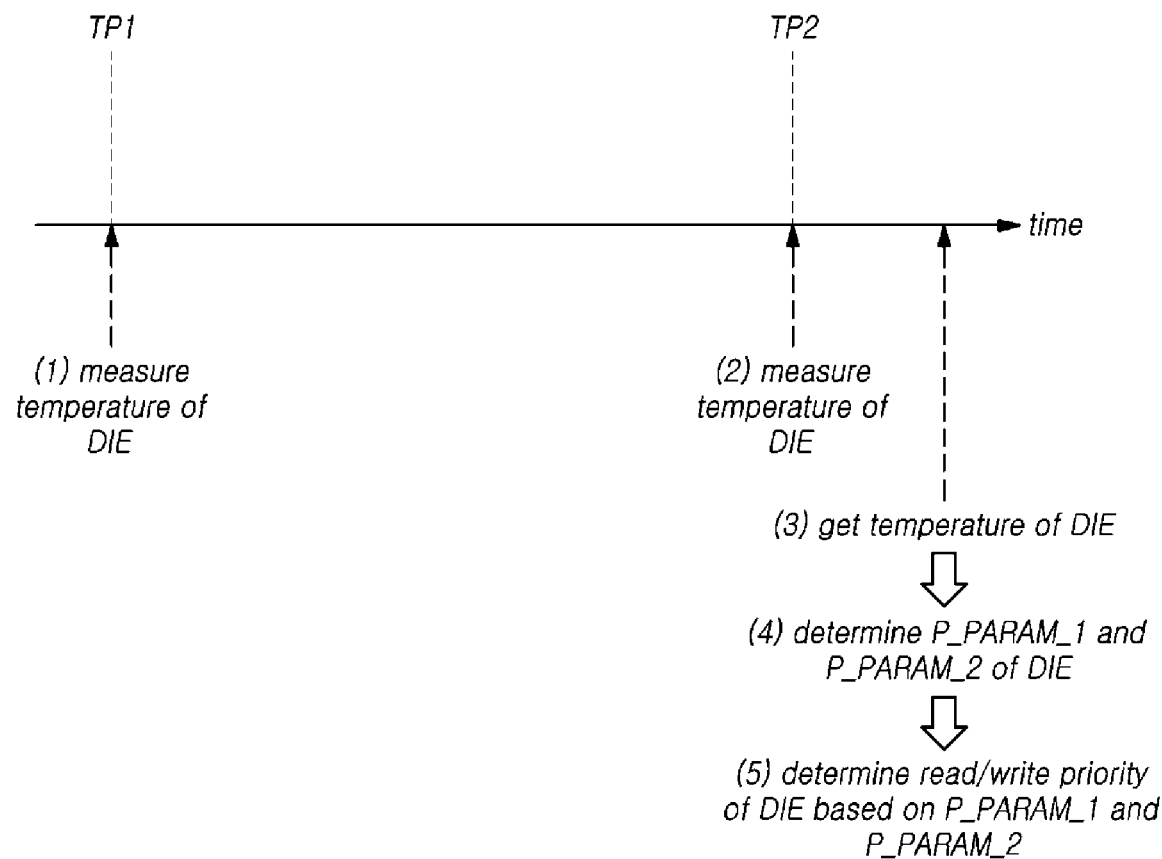
FIG. 5 is a diagram illustrating an example of an operation according to a time related to a storage device according to an embodiment of the disclosure.

FIG. 5 is a diagram illustrating an example of an operation according to a time related to a storage device according to an embodiment of the disclosure.

Referring to FIG. 5, the memory 110 of a storage device 100 may measure temperatures of the plurality of memory dies DIE at a first time point TP1 (1).

The memory 110 may measure temperatures of the plurality of memory dies DIE again at a second time point TP2 (2). The second time point TP2 is after the first time point TP1.

For example, the first time point TP1 may be a time point before the storage device 100 enters a sleep state, and the second time point TP2 may be a time point after the storage device 100 wakes up from the sleep state. When the storage device 100 is in the sleep state, the storage device 100 may operate in a low power mode.

A controller 120 of the storage device 100 may obtain temperatures of the plurality of memory dies DIE measured at the first time point TP1 and the second time point TP2, after the second time point TP2 (3).

The controller 120 may determine first priority parameters P_PARAM_1 and second priority parameters P_PARAM_2 for the plurality of memory dies DIE (4).

On the basis of the first priority parameters P_PARAM_1 and the second priority parameters P_PARAM_2 determined at (4), the controller 120 may determine priorities of the plurality of memory dies DIE for a read operation or a write operation (5).

Hereinafter, examples in which the storage device 100 determines the first priority parameters P_PARAM_1, the second priority parameters P_PARAM_2 and priorities of the plurality of memory dies DIE will be described with reference to FIGS. 6 to 8.

Figure 6:
FIG. 6 is a diagram illustrating an example in which a storage device determines first priority parameters of a plurality of memory dies according to an embodiment of the disclosure.
Figure 7:
FIG. 7 is a diagram illustrating an example in which a storage device determines second priority parameters of a plurality of memory dies according to an embodiment of the disclosure.
Figure 8:
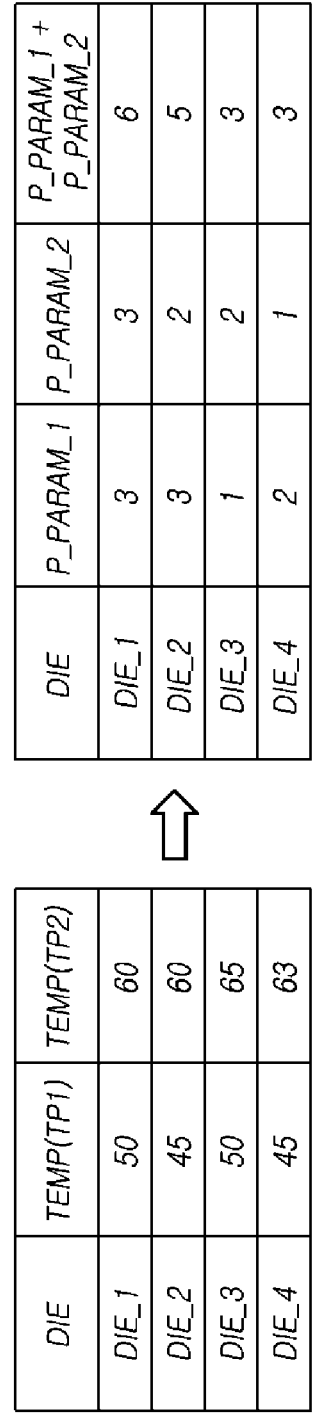
FIG. 8 is a diagram illustrating an example in which a storage device determines priorities of a plurality of memory dies according to an embodiment of the disclosure.

With reference to FIGS. 6 to 8, an example including four memory dies DIE_1, DIE_2, DIE_3 and DIE_4 that are included in the memory 110 and determining first priority parameters P_PARAM_1, second priority parameters P_PARAM_2 and priorities of the four memory dies DIE_1, DIE_2, DIE_3 and DIE_4. However, the number of memory dies in embodiments disclosed herein are not limited to 4, and in other embodiment memory dies may number 4 or more or less than 4.

FIG. 6 is a diagram illustrating an example in which a storage device determines first priority parameters of a plurality of memory dies according to an embodiment of the disclosure.

In FIG. 6, temperatures of the four memory dies DIE_1, DIE_2 DIE_3 and DIE_4 at the first time point TP1 are 50, 45, 50 and 45 degrees, respectively, and temperatures at the second time point TP2 are 60, 60, 65 and 63 degrees, respectively.

The controller 120 of the storage device 100 may determine a smaller first priority parameter P_PARAM_1 for a memory die, from among the memory dies DIE_1, DIE_2, DIE_3 and DIE_4, that has a higher temperature at the second time point TP2. That is to say, when the temperature of a first memory die among the memory dies DIE_1, DIE_2, DIE_3 and DIE_4 is higher than the temperature of a second memory die, the controller 120 may determine the first priority parameter P_PARAM_1 of the first memory die to be smaller than the first priority parameter P_PARAM_1 of the second memory die.

By delaying a read operation or a write operation on a memory die having a high temperature, and as a result delaying a time point at which the temperature of the memory die having a high temperature reaches a threshold temperature at which a throttling operation is executed, performance degradation can be minimized.

In FIG. 6, since the temperature of the memory die DIE_3 is the highest at 65 degrees at the second time point TP2, the first priority parameter P_PARAM_1 of the memory die DIE_3 may be determined as 1, which is the smallest value.

Since the temperature of the memory die DIE_4 is next highest at 63 degrees at the second time point TP2, the first priority parameter P_PARAM_1 of the memory die DIE_4 may be determined as 2, which is a value next to the lowest value of 1.

Since the temperatures of the memory die DIE_1 and the memory die DIE_2 are the lowest at 60 degrees at the second time point TP2, the first priority parameters P_PARAM_1 of the memory die DIE_1 and the memory die DIE_2 both may be determined as 3, which is a value greater than 1 and 2.

FIG. 7 is a diagram illustrating an example in which a storage device determines second priority parameters of a plurality of memory dies according to an embodiment of the disclosure.

In FIG. 7, temperatures of four memory dies DIE_1, DIE_2, DIE_3 and DIE_4 at a first time point TP1 are 50, 45, 50 and 45 degrees, respectively, and temperatures at a second time point TP2 are 60, 60, 65 and 63 degrees, respectively.

Accordingly, temperature variations during the time period between the first time point TP1 and the second time point TP2 for the four memory dies DIE_1, DIE_2, DIE_3 and DIE_4 are 10, 15, 15 and 18 degrees, respectively.

A controller 120 of a storage device 100 may determine a second priority parameter P_PARAM_2 of a memory die having a larger temperature variation during the time period between the first time point TP1 and the second time point TP2 to be smaller. That is to say, when the temperature variation of a first memory die among the memory dies DIE_1, DIE_2, DIE_3 and DIE_4 is larger than the temperature variation of a second memory die, the controller 120 may determine the second priority parameter P_PARAM_2 of the first memory die to be smaller than the second priority parameter P_PARAM_2 of the second memory die.

By delaying a read operation or a write operation on a memory die having a large temperature variation, and as a result delaying a time point at which the temperature of the memory die having a large temperature variation reaches a threshold temperature at which a throttling operation is executed, performance degradation can be minimized.

In FIG. 7, since the temperature variation between first time point TP1 and the second time point TP2 of the memory die DIE_4 is largest at 18 degrees, a second priority parameter P_PARAM_2 of the memory die DIE_4 may be determined as 1, which is the smallest value.

Since the temperature variations of the memory die DIE_2 and the memory die DIE_3 are next largest at 15 degrees, the second priority parameters P_PARAM_2 of the memory die DIE_2 and the memory die DIE_3 may be determined as 2, which is a value next to the lowest value of 1.

Since the temperature variation of the memory die DIE_4 is smallest at 10 degrees, the second priority parameter P_PARAM_2 of the memory die DIE_4 may be determined as 3, which is the largest value.

FIG. 8 is a diagram illustrating an example in which a storage device determines priorities of a plurality of memory dies according to an embodiment of the disclosure.

Referring to FIG. 8, a controller 120 of a storage device 100 may determine priorities of a plurality of memory dies DIE on the basis of the sums of first priority parameters P_PARAM_1 and second priority parameters P_PARAM_2.

The controller 120 may determine that a memory die with a relatively larger sum of the first priority parameter P_PARAM_1 and the second priority parameter P_PARAM_2, for a read operation or a write operation, has a relatively higher priority. That is to say, when the sum of the first priority parameter P_PARAM_1 and the second priority parameter P_PARAM_2 for a first memory die, among the plurality of memory dies DIE, is larger than the sum of the first priority parameter P_PARAM_1 and the second priority parameter P_PARAM_2 for a second memory die, the controller 120 may determine that the priority of the first memory die for a read operation or a write operation to be higher than the priority of the second memory die for a read operation or a write operation.

In FIG. 8, since the sum of the first priority parameter P_PARAM_1 and the second priority parameter P_PARAM_2 of the memory die DIE_1 among the four memory dies DIE_1, DIE_2, DIE_3 and DIE_4 is largest, the memory die DIE_1 has the highest priority.

Since the sum of the first priority parameter P_PARAM_1 and the second priority parameter P_PARAM_2 of the memory die DIE_2 is next largest, the memory die DIE_2 has the next highest priority.

In the memory die DIE_3 and the memory die DIE_4, the sums of the first priority parameters P_PARAM_1 and the second priority parameters P_PARAM_2 are smallest. The memory die DIE_3 and the memory die DIE_4 have the same sum of the first priority parameter P_PARAM_1 and the second priority parameter P_PARAM_2.

In this case, the controller 120 may determine the priorities of the memory die DIE_3 and the memory die DIE_4, by comparing for example, the first priority parameters P_PARAM_1 for these memory dies.

In FIG. 8, the first priority parameter P_PARAM_1 of the memory die DIE_4 is larger than the first priority parameter P_PARAM_1 of the memory die DIE_3. Accordingly, the controller 120 may determine the priority of the memory die DIE_4 to be higher than the priority of the memory die DIE_3.

FIG. 9 is a diagram illustrating another example of an operation according to a time related to a storage device according to an embodiment of the disclosure.

Referring to FIG. 9, as described above with reference to FIG. 5, a memory 110 of a storage device 100 may measure temperatures of the plurality of memory dies DIE at a first time point TP1 (1).

The memory 110 may measure temperatures of the plurality of memory dies DIE again at a second time point TP2 (2).

The controller 120 of the storage device 100 may obtain temperatures of the plurality of memory dies DIE measured at the first time point TP1 and the second time point TP2, after the second time point TP2 (3).

The controller 120 may determine first priority parameters P_PARAM_1 and second priority parameters P_PARAM_2 for the plurality of memory dies DIE (4).

On the basis of the first priority parameters P_PARAM_1 and the second priority parameters P_PARAM_2 determined at (4), the controller 120 may determine priorities of the plurality of memory dies DIE for a read operation or a write operation (5).

The controller 120 may initialize the priorities of the plurality of memory dies DIE at a third time point TP3 when a threshold time THR elapses from the second time point TP2 (6), and by initializing the priorities of the plurality of memory dies DIE, the priorities of the plurality of memory dies DIE are set to the same priority.

By initializing the plurality of memory dies DIE, the occurrence of a starvation problem can be avoided when, as a read or write operation is performed on only specific memory dies DIE according to priorities of the plurality of memory dies DIE, a read or write operation is continuously not performed on the remaining memory dies DIE.

FIG. 10 is a diagram illustrating a method for operating a storage device according to an embodiment of the disclosure.

Referring to FIG. 10, a method for operating a storage device 100 may include measuring temperatures of a plurality of memory dies DIE at the first time point TP1 (S1010).

The method for operating the storage device 100 may include measuring temperatures of the plurality of memory dies DIE at the second time point TP2 (S1020).

For example, the first time point TP1 may be a time point before the storage device 100 enters a sleep state, and the second time point TP2 may be a time point after the storage device 100 wakes up from the sleep state.

The method for operating the storage device 100 may include determining first priority parameters P_PARAM_1 for the plurality of memory dies DIE on the basis of the temperatures of the plurality of memory dies DIE at the second time point TP2 (S1030).

For example, the step S1030 may determine the first priority parameter P_PARAM_1 of the memory die, as between the first memory die and the second memory die, that has a higher temperature at the second time point TP2 to be the smaller value.

The method for operating the storage device 100 may include determining second priority parameters P_PARAM_2 for the plurality of memory dies DIE on the basis of temperature variations of the plurality of memory dies DIE during a time period between the first time point TP1 and the second time point TP2 (S1040).

For example, the step S1040 may determine the second priority parameter P_PARAM_2 of the memory die, as between the first memory die and the second memory die, that has a larger temperature variation during the time period between the first time point TP1 and the second time point TP2, to be smaller in value.

The method for operating the storage device 100 may include determining priorities of the plurality of memory dies DIE for a read operation or a write operation on the basis of the first priority parameters P_PARAM_1 and the second priority parameters P_PARAM_2 for the plurality of memory dies DIE (S1050).

For example, the step S1050 may determine the priority, for a read operation or a write operation, of a memory die, as between the first memory die and the second memory die, with a larger sum of the first priority parameter P_PARAM_1 and the second priority parameter P_PARAM_2 to have a higher priority.

In another example, when the sum of the first priority parameter P_PARAM_1 and the second priority parameter P_PARAM_2 for a first memory die among the plurality of memory dies DIE is the same as the sum of the first priority parameter P_PARAM_1 and the second priority parameter P_PARAM_2 for a second memory die, the step S1050 may determine that the priority, for a read operation or a write operation, of a memory die with the larger first priority parameter P_PARAM_1 should be higher.

The method for operating the storage device 100 may further include initializing priorities of the plurality of memory dies DIE when the threshold time THR elapses from the second time point TP2.

Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims.

What is claimed is:

1. A storage device comprising:
a memory including a plurality of memory dies; and
a controller configured to obtain temperatures of the plurality of memory dies measured at a first time point and a second time point, to determine first priority parameters for the plurality of memory dies on the basis of the temperatures of the plurality of memory dies at the second time point, to determine second priority parameters for the plurality of memory dies on the basis of temperature variations of the plurality of memory dies during a time period between the first time point and the second time point, to determine priorities of the plurality of memory dies for a read operation or a write operation on the basis of the first priority parameters and the second priority parameters for the plurality of memory dies, to determine priorities for the plurality of memory dies from a highest priority to a lowest priority, and to use the plurality of memory dies in order of priority from the highest priority to the lowest priority in executing a read or write operation.

2. The storage device according to claim 1, wherein
the first time point is a time point before the storage device enters a sleep state, and
the second time point is a time point after the storage device wakes up from the sleep state.

3. The storage device according to claim 1, wherein
the plurality of memory dies include a first memory die and a second memory die, and
when a temperature of the first memory die is higher than a temperature of the second memory die at the second time point, the controller determines the first priority parameter of the first memory die to be smaller than the first priority parameter of the second memory die.

4. The storage device according to claim 3, wherein, when a temperature variation of the first memory die is larger than a temperature variation of the second memory die during the time period between the first time point and the second time point, the controller determines the second priority parameter of the first memory die to be smaller than the second priority parameter of the second memory die.

5. The storage device according to claim 4, wherein, when a sum of the first priority parameter and the second priority parameter for the first memory die is larger than a sum of the first priority parameter and the second priority parameter for the second memory die, the controller determines the priority of the first memory die for a read operation or a write operation to be higher than the priority of the second memory die for a read operation or a write operation.

6. The storage device according to claim 5, wherein, when a sum of the first priority parameter and the second priority parameter for the first memory die is the same as a sum of the first priority parameter and the second priority parameter for the second memory die, the controller determines the priority, for a read operation or a write operation, of a memory die having a larger first priority parameter to be higher, as between the first memory die and the second memory die.

7. The storage device according to claim 1, wherein the controller initializes the priorities for the plurality of memory dies when a threshold time elapses from the second time point, and the threshold time is set to prevent the occurrence of starvation in the storage device.

8. The storage device according to claim 1, wherein
the use of the plurality of memory dies in order of priority from the highest priority to the lowest priority in executing a read or write operation occurs before the plurality of dies reaches a threshold at which a throttling operation is executed.

9. A method for operating a storage device, comprising:
measuring temperatures of a plurality of memory dies at a first time point;
measuring temperatures of the plurality of memory dies at a second time point;
determining first priority parameters for the plurality of memory dies on the basis of the temperatures of the plurality of memory dies at the second time point;
determining second priority parameters for the plurality of memory dies on the basis of temperature variations of the plurality of memory dies during a time period between the first time point and the second time point;

determining priorities of the plurality of memory dies for a read operation or a write operation on the basis of the first priority parameters and the second priority parameters for the plurality of memory dies;

determining priorities for the plurality of memory dies from a highest priority to a lowest priority; and using the plurality of memory dies in order of priority from the highest priority to the lowest priority in executing a read or write operation.

10. The method according to claim 9, wherein the first time point is a time point before the storage device enters a sleep state, and the second time point is a time point after the storage device wakes up from the sleep state.

11. The method according to claim 9, wherein the determining of the first priority parameters for the plurality of memory dies determines a first priority parameter of a memory die, among the plurality of memory dies, to be smaller when the memory die, as between a first memory die and a second memory die, has a higher temperature at the second time point.

12. The method according to claim 11, wherein the determining of the second priority parameters for the plurality of memory dies determines a second priority parameter of a memory die, among the plurality of memory dies, to be smaller when the memory die, as between a first memory die and a second memory die, has a larger temperature variation during the time period between the first time point and the second time point.

13. The method according to claim 12, wherein the determining of the priorities of the plurality of memory dies for a read operation or a write operation determines a higher priority for a memory die, as between a first memory die and a second memory die, with a larger sum of a first priority parameter and a second priority parameter.

14. The method according to claim 13, wherein, when a sum of a first priority parameter and a second priority parameter for the first memory die is the same as a sum of a first priority parameter and a second priority parameter for the second memory die, the determining of the priorities of the plurality of memory dies for a read operation or a write operation determines a higher priority for a memory die with a larger first priority parameter.

15. The method according to claim 9, further comprising:

initializing the priorities for the plurality of memory dies when a threshold time elapses from the second time point, and the threshold time is set to prevent the occurrence of starvation in the storage device.

16. The method according to claim 9, wherein using the plurality of memory dies in order of priority from the highest priority to the lowest priority in executing a read or write operation occurs before the plurality of dies reaches a threshold at which a throttling operation is executed.

17. A controller comprising:

a memory interface capable of communicating with a memory including a plurality of memory dies; and a control circuit configured to determine first priority parameters and second priority parameters for the plurality of memory dies on the basis of temperatures of the plurality of memory dies measured at a first time point and a second time point, to determine priorities of the plurality of memory dies according to which a read operation or a write operation is executed, on the basis of the first priority parameters and the second priority parameters for the plurality of memory dies, to determine priorities for the plurality of memory dies from a highest priority to a lowest priority, and to use the plurality of memory dies in order of priority from the highest priority to the lowest priority in executing a read or write operation.

* * * * *